(12) United States Patent
Harmon et al.

(10) Patent No.: US 6,464,102 B1
(45) Date of Patent: Oct. 15, 2002

(54) BOX CLOSING MECHANISM

(75) Inventors: Jason Harmon, Bristol, CT (US); Ranganadha Kumar Erra, Andhra Pradesh (IN); Pankaj Shrivastava, Andhra Pradesh (IN); Prakash Viswanathan, Andhra Pradesh (IN)

(73) Assignee: General Electric Company, Schenectady, NY (US)

( * ) Notice: Subject to any disclaimer, the term of this patent is extended or adjusted under 35 U.S.C. 154(b) by 121 days.

(21) Appl. No.: 09/669,537

(22) Filed: Sep. 26, 2000

(51) Int. Cl.$^7$ .................. B65D 43/16; B65D 43/22
(52) U.S. Cl. ............ 220/835; 220/4.02; 292/86; 292/87
(58) Field of Search .................. 292/86, 80, 87; 220/324, 326, 835, 827, 829, 830, 3.8, 4.02, 4.22, 4.21, 4.24

(56) References Cited

U.S. PATENT DOCUMENTS

| | | | | |
|---|---|---|---|---|
| 761,461 A | * | 5/1904 | Eigen | 220/326 |
| 832,284 A | * | 10/1906 | White | 220/326 |
| 1,975,173 A | * | 10/1934 | Pennock et al. | 220/326 |
| 2,339,994 A | * | 1/1944 | Houlihan | 292/86 |
| 2,656,206 A | * | 10/1953 | Piker | 292/86 |
| 3,281,936 A | * | 11/1966 | Haan et al. | 220/326 |
| 3,339,956 A | * | 9/1967 | Bencene et al. | 292/127 |
| 3,394,838 A | * | 7/1968 | Larkin | 220/326 |
| 3,598,419 A | * | 8/1971 | Nisper et al. | |
| 4,630,852 A | * | 12/1986 | White et al. | 292/87 |
| 4,964,661 A | * | 10/1990 | Cadwell et al. | 292/87 |
| 5,033,634 A | * | 7/1991 | Batchelor et al. | 292/87 |
| 5,871,113 A | * | 2/1999 | Conway et al. | 220/326 |

* cited by examiner

Primary Examiner—Nathan J. Newhouse
(74) Attorney, Agent, or Firm—Cantor Colburn LLP (57) ABSTRACT

A housing for a circuit breaker motor operating mechanism is disclosed. The housing comprises a base having a plurality of walls connected to a floor thereby defining an interior volume; a cover hingedly attached to one wall of the plurality of walls; and a locking device including a first member connected to the base and a second member connected to the cover and engaged to the first member, the locking device positively securing the cover to the base thereby enclosing the interior volume.

7 Claims, 9 Drawing Sheets

BOX CLOSING MECHANISM

BACKGROUND OF THE INVENTION

This invention relates to locking devices in the housing of a circuit breaker motor operating mechanism.

Current locking devices in the housing of a circuit breaker motor operating mechanism often fail to provide a positive or affirmative locking of the cover of the housing to the base of the housing after the cover has been closed. As such, the cover may become unlatched and may open while in service. Alleviating this problem may require inspection and reworking of the parts of the locking device after assembly of the circuit breaker motor operating mechanism is completed, thus adding excessive and unnecessary labor and cost to the motor operating mechanism. It also introduces the uncontrollable process of reworking the locking device into the motor operating mechanism, thus further compromising performance of the locking device.

Thus it is desireable to provide a locking device in the housing of a circuit breaker motor operating mechanism that is self-locking, i.e, wherein the device is activated automatically every time the cover of the housing is closed and no user tasks are necessary to activate the locking mechanism. It is also desireable to provide such a locking device that comprises a minimum number of parts and is simple in its implementation and manufacture.

BRIEF SUMMARY OF THE INVENTION

A housing for a circuit breaker motor operating mechanism is disclosed. The housing comprises a base having a plurality of walls connected to a floor thereby defining an interior volume; a cover hingedly attached to one wall of the plurality of walls; and a locking device including a first member connected to the base and a second member connected to the cover and engaged to the first member, the locking device positively securing the cover to the base thereby enclosing the interior volume.

DETAILED DESCRIPTION OF THE INVENTION

Figure 1:
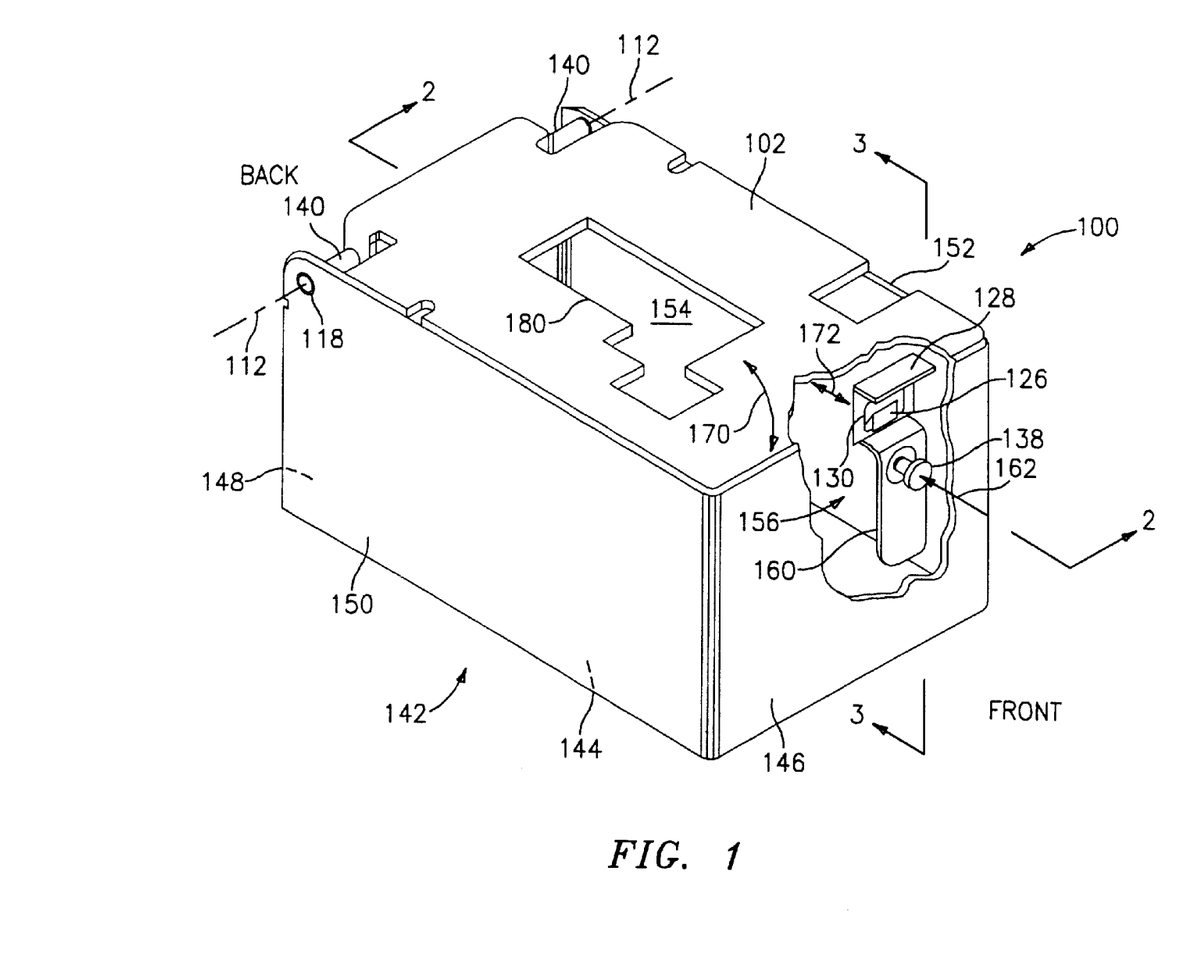
FIG. 1 is a three dimensional view of the housing for the circuit breaker motor operating mechanism having a partial cut-away view showing the position of the locking device of the present invention.
Figure 2:
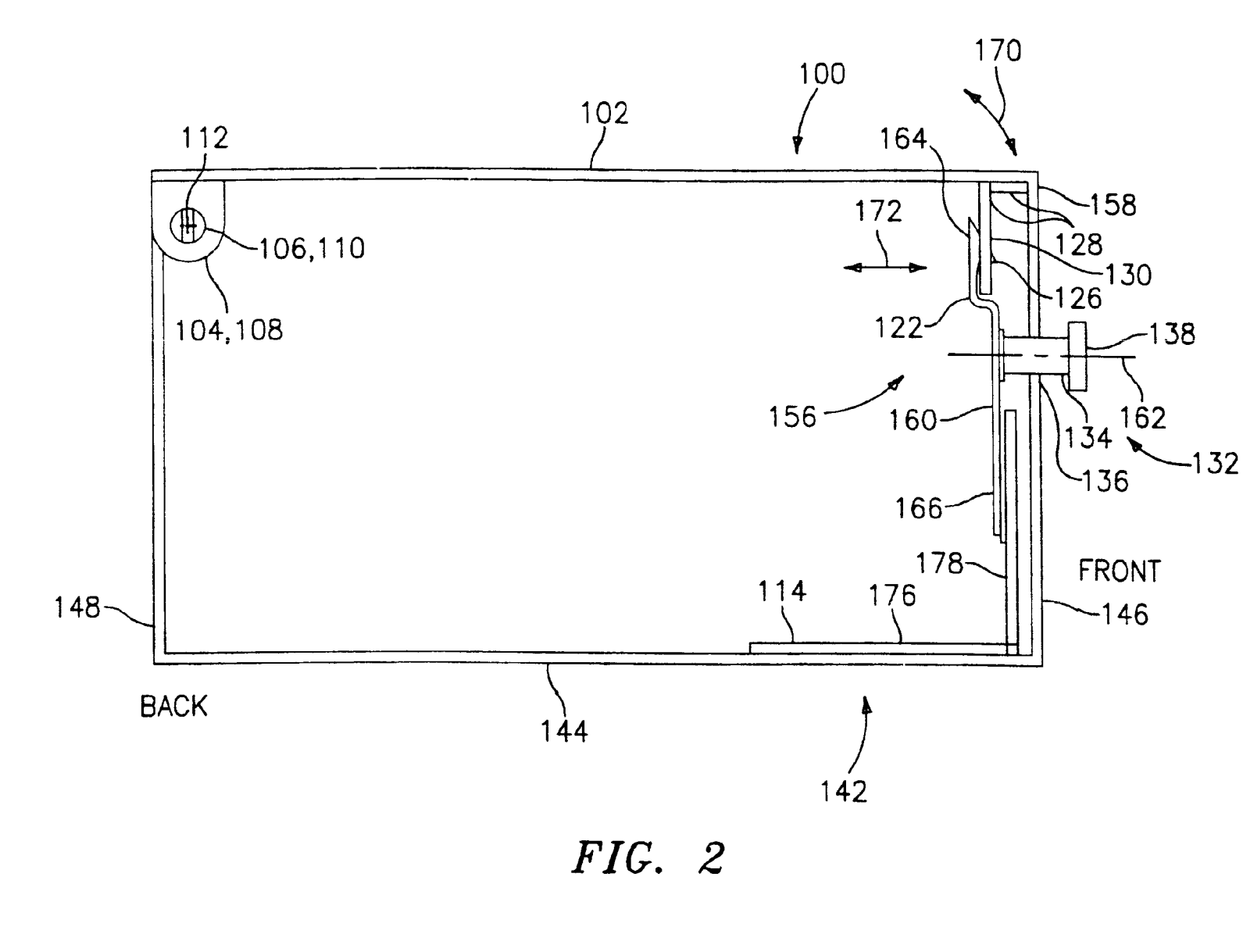
FIG. 2 is a sectional side view of the housing of the circuit breaker motor operating mechanism of FIG. 1.
Figure 3:
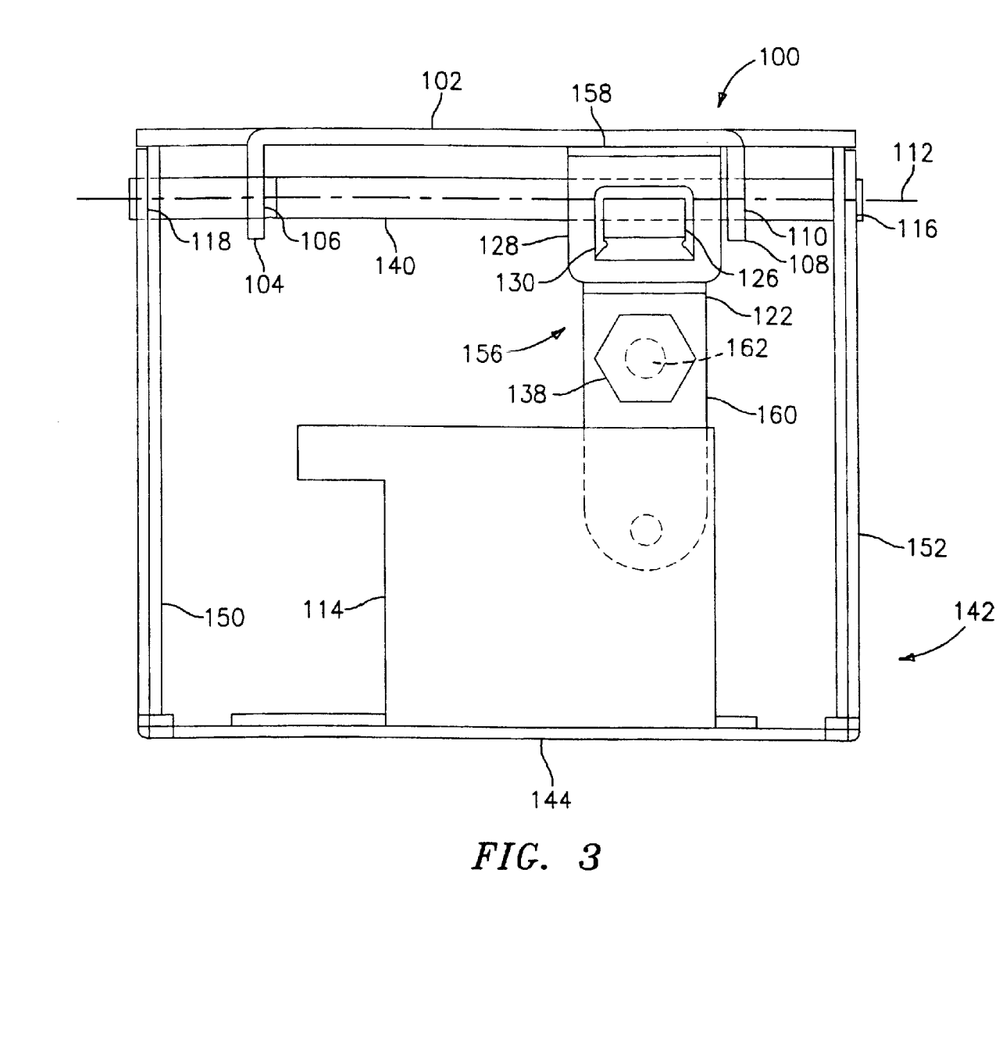
FIG. 3 is a front view of the housing of the circuit breaker motor operating mechanism of FIG. 1.

Referring to FIG. 1, in a first embodiment of the present invention, a housing for a circuit breaker motor operating mechanism is generally shown at 100. The circuit breaker motor operating mechanism housing 100 is generally comprised of a base 142 and a cover 102. The base 142 is comprised of a plurality of walls 146, 148, 150, 152 connected to one another and to a floor member 144, thereby defining an interior volume 154. The interior volume 154 may typically contain a motor for mounting to a circuit breaker (not shown). A handle (not shown) is connected to the motor and protrudes through an opening 180 in the cover 102. To access the circuit breaker motor operating mechanism, the cover 102 must be raised, while yet the cover 102 must also be capable of being positively locked in a closed position as shown in FIGS. 1, 2 and 3. The cover 102 is attached to a rod 140 at a back end of the cover 102 by way of a pair of tab-like hinge mechanisms 104, 108 (FIG. 3) in the cover 102. The rod 140 is in turn connected to the side walls 150, 152 at the back end of the base 142. The rod 140 may be fixed to the hinge mechanisms 104, 108 and rotate with respect to the base 142 or may be fixed to the base 142 and the cover 102 may rotate with respect to the rod 140. In either case, the cover 102 is operative to swing toward or away from the base along the arc 170. At a front end of the base 142, the cover 102 is releasably secured to the front wall 146 of the base 142 by a locking device 156, thereby enclosing the interior volume 154.

Figure 4:
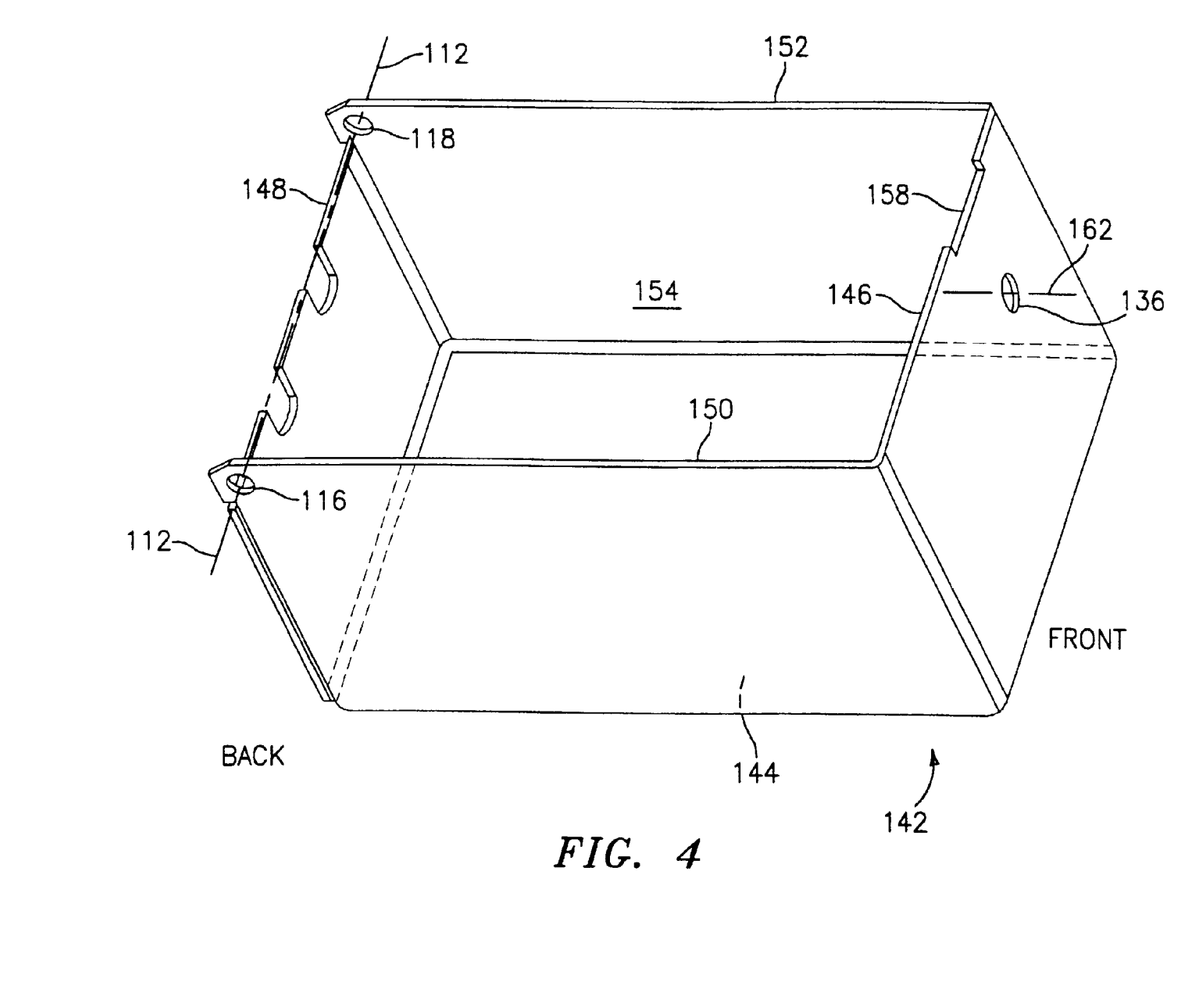
FIG. 4 is a three dimensional view of the base of the housing of the circuit breaker motor operating mechanism of FIG. 1.
Figure 5:
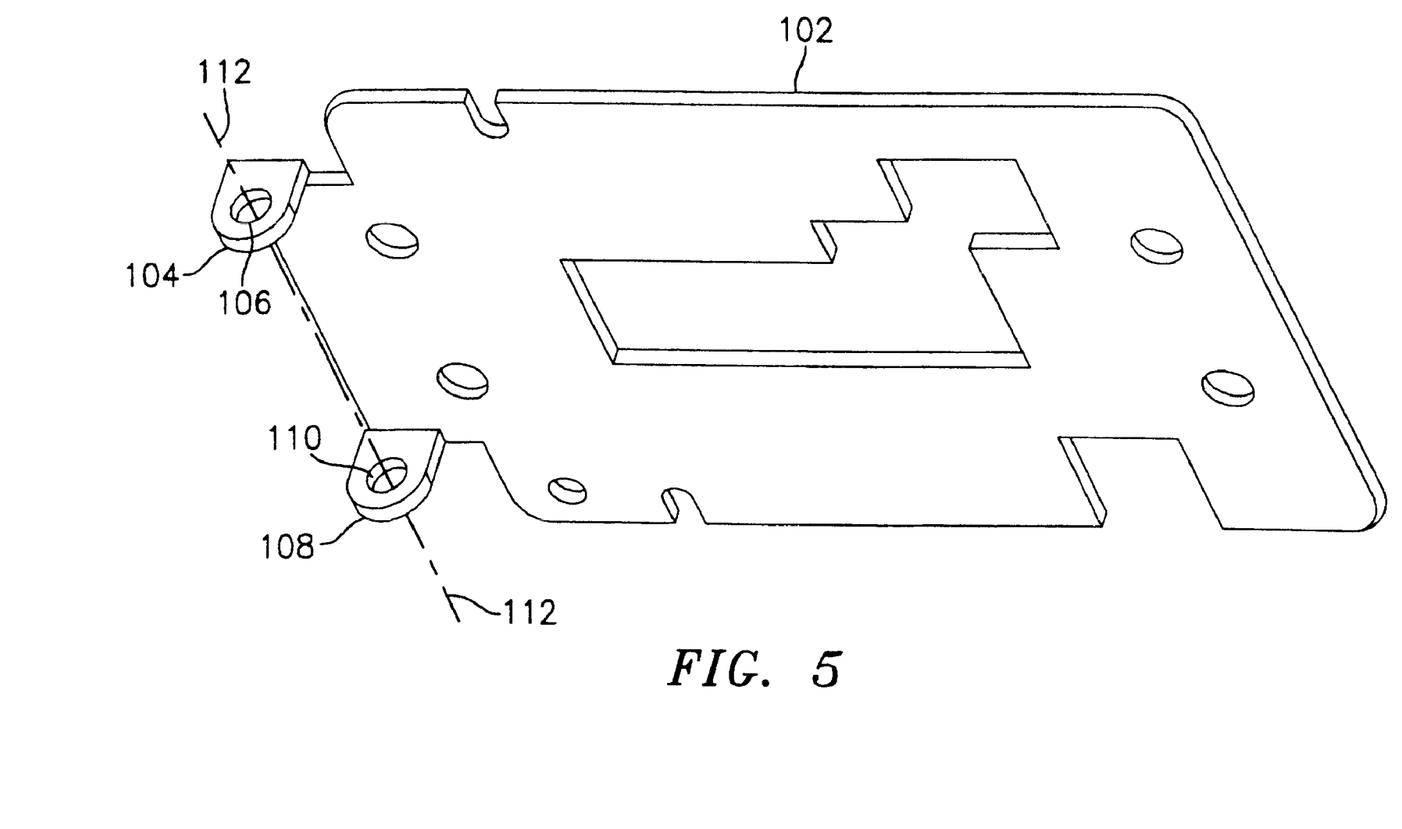
FIG. 5 is a three dimensional view of the cover of the housing of the circuit breaker motor operating mechanism of FIG. 1.
Figure 7:
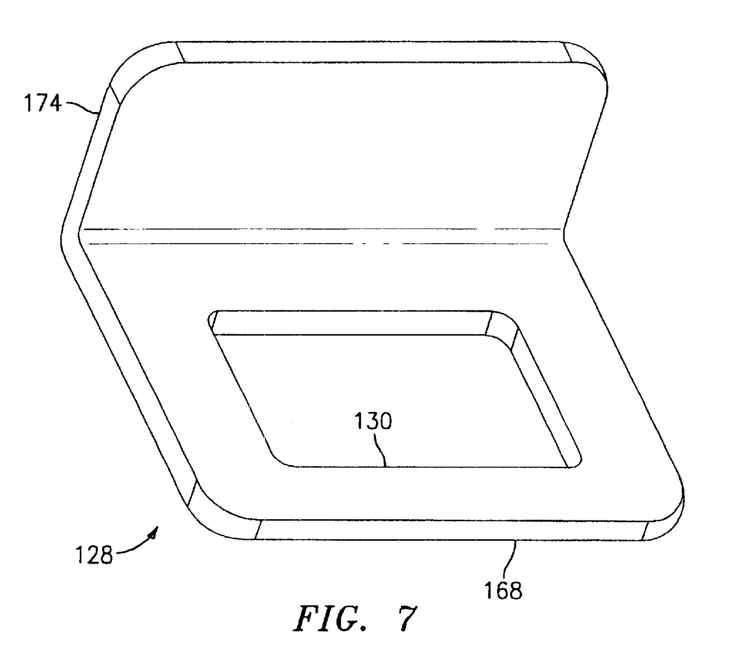
FIG. 7 is a three dimensional view of the bracket of the housing of the circuit breaker motor operating mechanism of FIG. 1.
Figure 8:
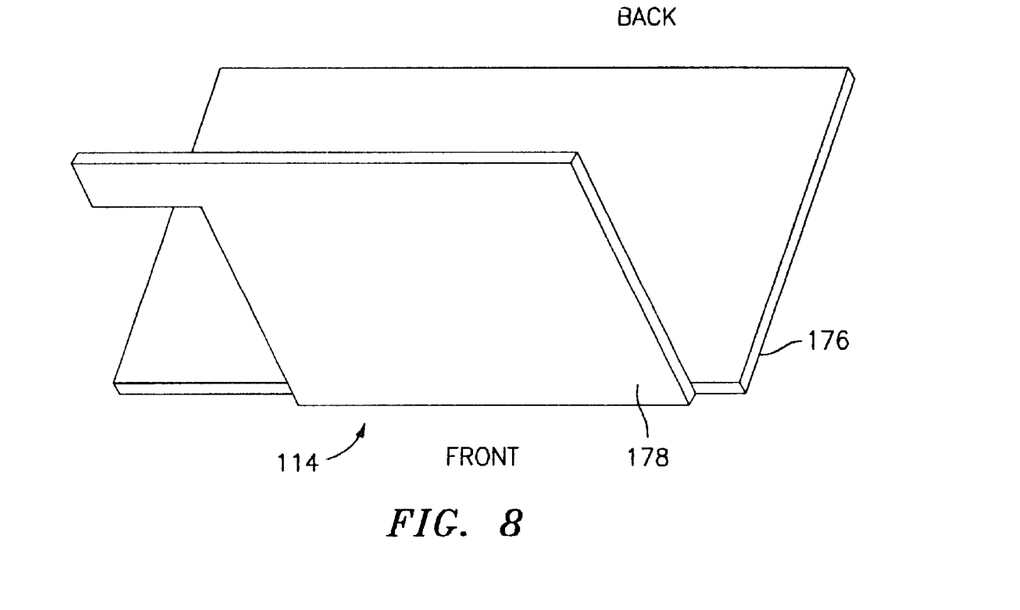
FIG. 8 is a three dimensional view of the bent plate of the housing of the circuit breaker motor operating mechanism of FIG. 1.

Referring to FIG. 2, the locking device 156 is shown comprising a locking bracket 128 attached to the interior side of the cover 102; a bent plate 114 connected to the floor 144 of the base 142; a releasing latch 160 engaged at a first end 164 to the locking bracket 128 and connected at a second end 166 to the bent plate 114. The locking device 156 further comprises a push button 132 connected to the releasing latch 160 and extending from the releasing latch 160 through a hole 136 in the front wall 146 to the exterior of the base 142. The locking bracket 128 (FIG. 7) comprises an "L" shaped plate with an aperture 130 in a first member 168 thereof. A second member 174 of the locking bracket 128 is affixed to the underside of the cover 102 and a notch 158 (FIG. 4) in the front wall 146 receives the second member 174 of the locking bracket when the cover 102 is in the closed position. The bent plate 114 (FIG. 8) comprises an "L" shaped plate, a first member 176 of which is connected to the floor member 144 of the base 142 and a second member 178 is connected to the second end 166 of the releasing latch 160.

Figure 6:
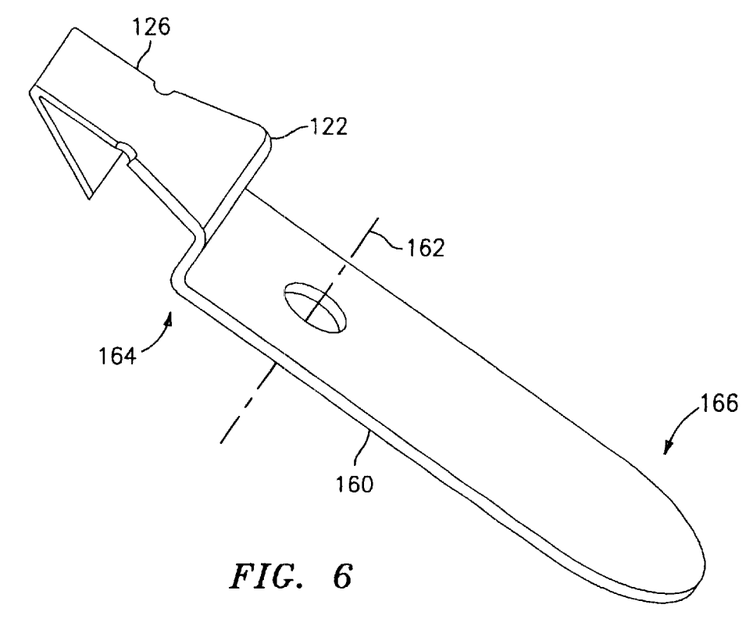
FIG. 6 is a three dimensional view of the push release latch of the housing of the circuit breaker motor operating mechanism of FIG. 1.
Figure 9:
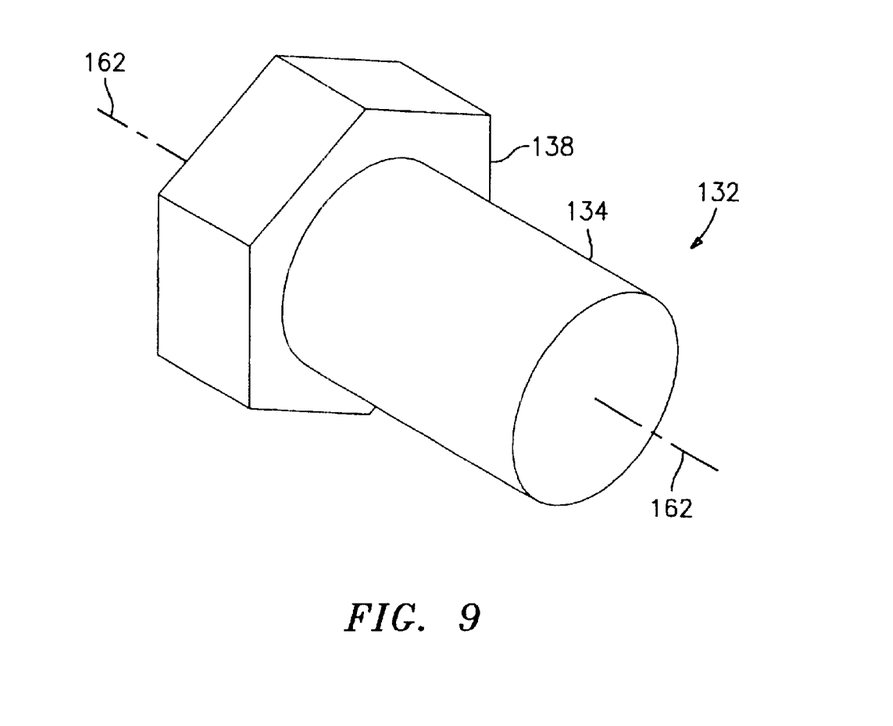
FIG. 9 is a three dimensional view of the push button of the housing of the circuit breaker motor operating mechanism of FIG. 1.

Referring to FIG. 6, the releasing latch 160 is a bar like fixture having a first end 164 and a second end 166. The first end 164 comprises a neck portion 122 and a catch mechanism 126. The neck portion 122 comprises a double bend, out of the plane of the second end 166 of the releasing latch 160, narrowing to the catch mechanism 126. The catch mechanism 126 comprises a wedge like claw or hook connected to the neck portion 122 and operative to be engaged to the aperture 130 in the locking bracket 128 when the cover 102 is in the closed position. The catch mechanism 126 is disengaged from the aperture 130 when the cover 102 is in the open position. The releasing latch 160 is connected to the second member 178 of the bent plate 114 at the second end 166 of the releasing latch 160. The combination of the releasing latch 160 and the second member 178 of the bent plate 114 is such as to act in the nature of a cantilever beam whereby the first end 164 of the releasing latch 160 is the free end of the cantilever beam and the second member 178 of the bent plate 114 is the fixed end thereof about which rotation may be had. The cantilever beam 160, 178 has an intrinsic spring like nature whereby the application of a force on the push button 132 (FIG. 9) along the line 162, acts to displace the free end of the cantilever beam 160, 178 along the arc 172 (FIGS. 1 and 2) and to thereby disengage the catch mechanism 126 from the aperture 130 of the locking bracket 128, allowing the cover 102 to open along the arc 170 (FIGS. 1 and 2). However, releasing the force on the push button 132 allows the cantilever beam 160, 178 to return to its original position along arc 172, while the cover 102 remains in the open position. In order to return the cover 102 to the closed position and to remain locked in place, the cover 102 is lowered along the arc 170 thereby causing the catch mechanism 126 to positively engage the aperture 130, thus positively locking the cover 102 in a closed position and preventing disengagement of the cover 102 from the base 142.

Figure 10:
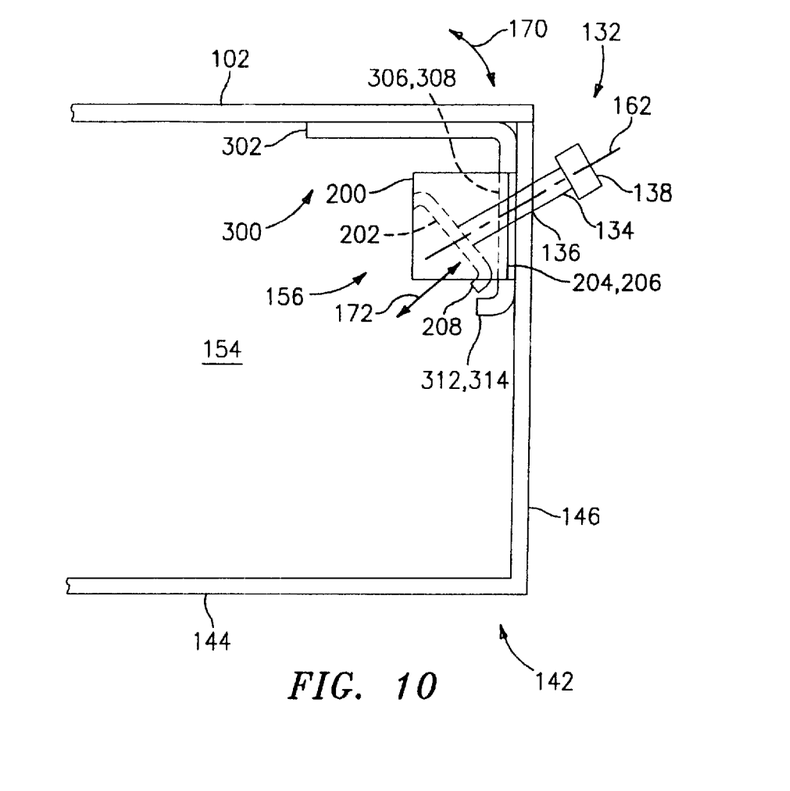
FIG. 10 is a sectional side view of a second embodiment of the locking device of the present invention.
Figure 11:
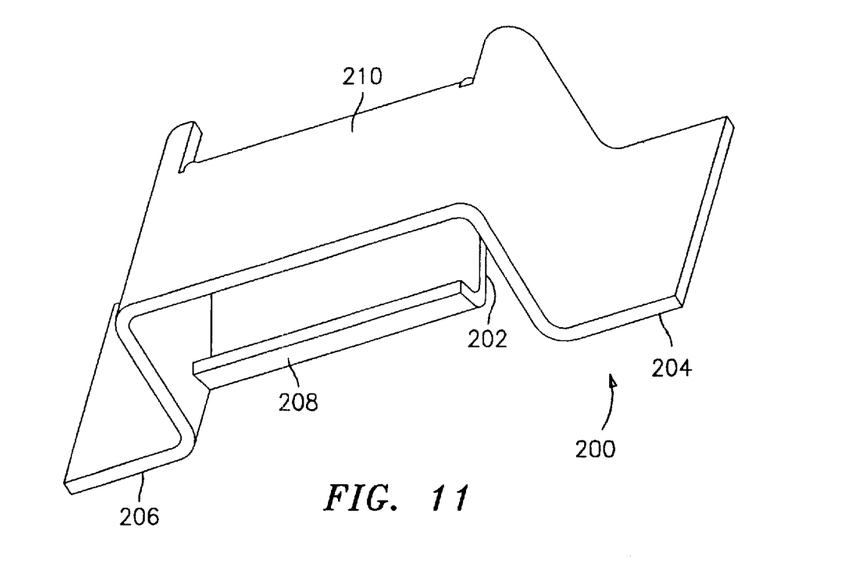
FIG. 11 is a three dimensional view of a catch mechanism of the second embodiment of the locking device of the present invention.
Figure 12:
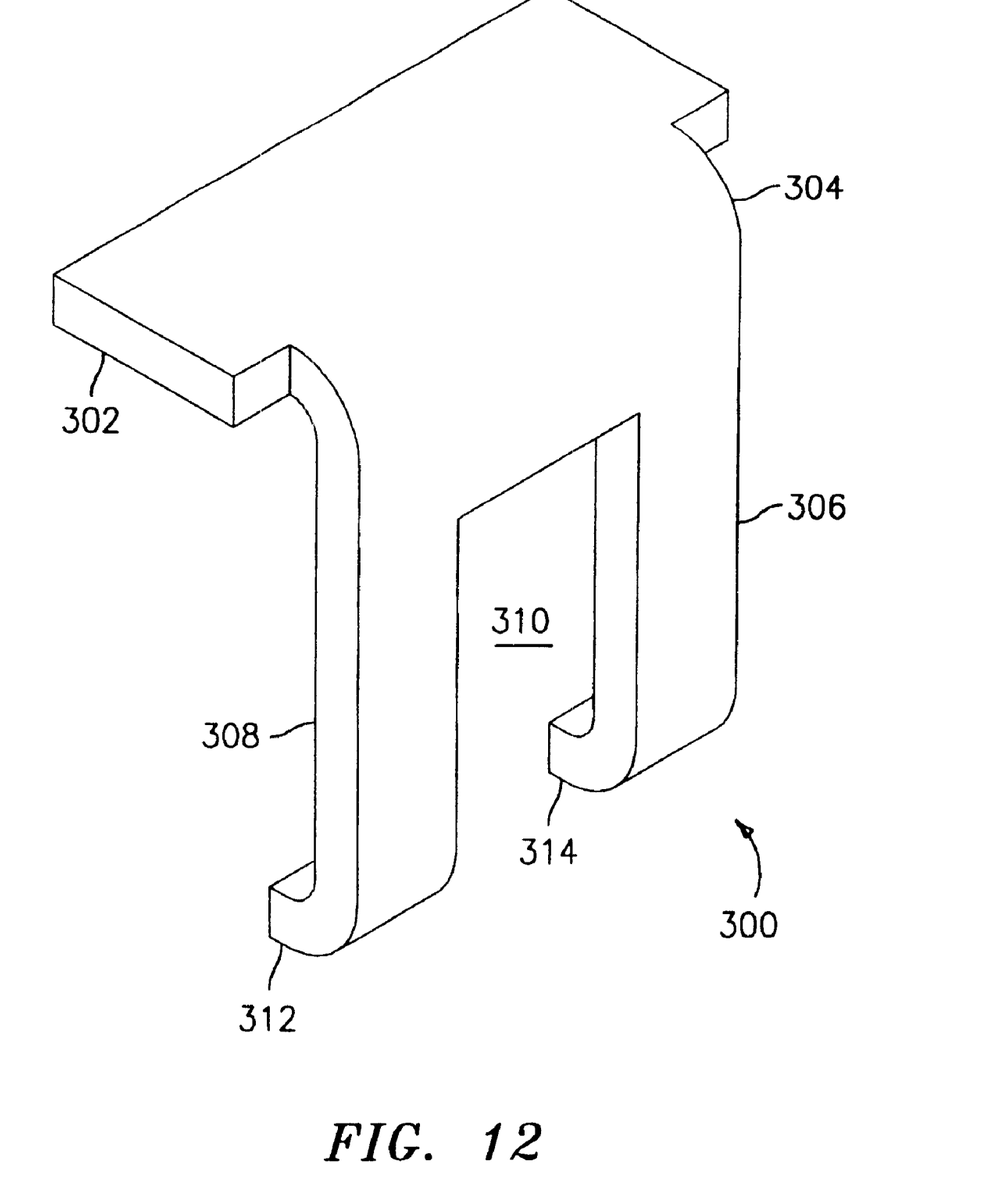
FIG. 12 is a three dimensional view of a latching mechanism of the second embodiment of the locking device of the present invention.

Referring to FIG. 10, a second embodiment of the locking device 156 of the present invention is shown. The second embodiment of the locking device 156 comprises a lug 200, a clevis device 300 and the push button 132. The lug 200 (FIG. 11) is a fixture having a first flange 204 and a second flange 206 for attachment to the interior side of the front wall 146 of the base 142. The lug 200 further comprises a resilient member 202 positioned between and connected to the first flange 204 and second flange 206 at a middle plate 210. The resilient member 202 is a tongue like member that acts as a cantilever beam. The clevis device 300 (FIG. 12) is a two part fixture having a first plate section 302 for attachment to the underside of the cover 102 and a second plate section 304 substantially at right angles to the first plate section 302. The second plate section 304 includes a first fork like member 306 and a second fork like member 308 defining a clearance 310 therebetween. The first and second fork like members 306, 308 also include a first lip 312 and a second lip 314. The lug 200 is attached to the interior side of the front wall 146 of the base 142 at the first flange and second flanges 204, 206, and the clevis device 300 is attached to the interior side of the cover 102 at the first plate section 302 such that the post 134 of the push button 132 passes through the hole 136 in the front wall 146 and the clearance 310 between the first and second fork like members 306, 308. When the cover 102 is in the closed position, the first and second lip 312, 314 engage the lip 208 of the tongue 202 so as to prevent the cover 102 from opening along the arc 170. By the application of a force along the line 162, the tongue 202, acting in the manner of a cantilever beam, disengages from the first and second lip 312, 314, and the cover 102 is allowed to open along the arc 170. Releasing the force on the push button 132 allows the tongue 202 to return to its original position along arc 172, while the cover 102 remains in the open position. In order to return the cover 102 to the closed position and to remain locked in place, the cover 102 is lowered along the arc 170 thereby causing the first and second lip 312, 314 to positively engage the lip 208 of the tongue 202, thus positively locking the cover 102 in a closed position and preventing disengagement of the cover 102 from the base 142.

As best understood from FIGS. 1, 2 and 10 it will be appreciated that either the base 142 may be permanently affixed to a structure allowing the cover 102 to move freely, or the cover 102 may be permanently affixed to a structure allowing the base 142 to move freely. Furthermore, the locking devices of the first and second embodiment of the present invention and the housing thereof, may be manufactured of a plurality of materials. In particular, Beryllium Copper is used for its ability to withstand corrosion.

Thus it is seen from the foregoing description of the present invention that a locking device in the housing of a circuit breaker motor operating mechanism is provided. The locking device is self-locking, i.e, the device is activated automatically every time the cover of the housing is closed and no user tasks are necessary to activate the locking mechanism. It is also provided that the locking device comprises a minimum number of parts and is simple in its implementation and manufacture.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A housing for a circuit breaker motor operating mechanism, the housing comprising:
   a base having a plurality of walls connected to a floor thereby defining an interior volume;
   a cover hingedly attached to one wall of the plurality of walls; and
   a locking device including a first member connected to the base and a second member connected to the cover and engaged to the first member for positively securing the cover to the base in a closed position thereby enclosing the interior volume;
   wherein the first member comprises a lug having first and second flanges for attachment to the base; a middle plate joining the first and second flanges; and a cantilever beam connected to the middle plate;
   wherein the cantilever beam includes a first lip at the free end thereof.

2. The housing as set forth in claim 1 wherein the second member comprises a clevis having a first section for attachment to the interior side of the cover and a second member having first and second fork members connected to the first section, wherein the first and second forked members define a clearance therebetween.

3. The housing as set forth in claim 2 wherein the first and second fork members include a lip for engagement with the first lip of the cantilever beam when the cover is in the closed position.

4. The housing as set forth in claim 1 wherein the housing is comprised of Beryllium Copper.

5. A locking device for a circuit breaker motor operating mechanism housing having a base including a plurality of walls connected to a floor thereby defining an interior volume and a cover hingedly attached to one wall of the plurality of walls, the locking device comprising:

a first member connected to the base;

wherein the first member comprises a lug having first and second flanges for attachment to the base; a middle plate joining the first and second flanges; and a cantilever beam connected to the middle plate;

wherein the cantilever beam includes a first lip at the free end thereof; and a second member connected to the cover and engaged to the first member for positively securing the cover to the base in a closed position thereby enclosing the interior volume;

wherein the second member comprises a clevis having a first section for attachment to the cover and a second section having first and second fork members connected to the first section, wherein the first and second forked members define a clearance therebetween.

6. The housing as set forth in claim 5 wherein the first and second fork members include a lip for engagement with the first lip of the cantilever beam when the cover is in the closed position.

7. The locking device as set forth in claim 5 wherein the locking device is comprised of Beryllium Copper.

* * * * *